United States Patent [19]

Liu

[11] Patent Number: 5,759,919
[45] Date of Patent: Jun. 2, 1998

[54] METHOD FOR REDUCING GATE OXIDE DAMAGES DURING GATE ELECTRODE PLASMA ETCHING

[75] Inventor: Ming-Hsi Liu, Chungli, Taiwan

[73] Assignee: Winbond Electronics Corporation, Taiwan

[21] Appl. No.: 697,024

[22] Filed: Aug. 16, 1996

[30] Foreign Application Priority Data

Jun. 8, 1996 [TW] Taiwan ................... 85106892

[51] Int. Cl.[6] ............................................. H01L 21/00
[52] U.S. Cl. .................. 438/694; 438/710; 438/719; 216/67
[58] Field of Search ..................... 156/643.1, 625.1, 156/644.1; 216/37, 67; 437/228

[56] References Cited

U.S. PATENT DOCUMENTS

| | | | |
|---|---|---|---|
| 4,472,237 | 9/1984 | Deslauriers et al. | 156/643 |
| 5,030,590 | 7/1991 | Amini et al. | 437/233 |
| 5,366,913 | 11/1994 | Nakao | 437/41 |
| 5,368,684 | 11/1994 | Ishikawa et al. | 156/643 |
| 5,603,848 | 2/1997 | Beratan et al. | 216/67 |

*Primary Examiner*—R. Bruce Breneman
*Assistant Examiner*—Luz Alejandro
*Attorney, Agent, or Firm*—Rabin, Champagne, & Lynt, P.C.

[57] ABSTRACT

A method of forming a gate on a silicon substrate with a preformed film of gate oxide. A polysilicon layer is formed on the gate oxide. A slit is then formed in a predetermined area of the polysilicon layer. A masking layer is formed on the surface of the polysilicon layer surrounded by the slit. Exposed polysilicon is then removed, and the masking layer is removed.

7 Claims, 8 Drawing Sheets

METHOD FOR REDUCING GATE OXIDE DAMAGES DURING GATE ELECTRODE PLASMA ETCHING

BACKGROUND OF THE INVENTION

Field of the Invention

This invention relates in general to the fabrication of semiconductor integrated circuits (ICs), and more particularly to reduction of gate oxide damage during a gate electrode plasma etching process in semiconductor IC manufacture.

Description of the Related Art

Evidence is mounting that the primary cause of oxide damage during plasma etching is a build-up of charge on conductors. Some data show that plasma nonuniformity across the wafer surface plays a major role in this damage. Plasma nonuniformity produces electron and ion currents that do not balance locally, and as a result, oxide damage can be generated. The apparent sequence of events leading to charge-induced gate oxide damage during etching of a conductive gate electrode is shown in FIGS. 1A through 1D.

Referring to FIG. 1A, a thin film of gate oxide 10 is first formed on the surface of a silicon substrate (not shown). A layer of polysilicon 12 is then formed on the gate oxide 10. Next, a photoresistance layer 14 is formed on a portion of the surface of polysilicon layer 12 reserved for the gate. The polysilicon layer 12 is then etched by plasma etching to form the gate of the transistor. The plasma comprises electrons e and ions i. Non-uniformities in the plasma discharge produce locally unbalanced ion and electron currents. For example, electron current can be higher than ion current where the plasma potential is at a minimum (in this figure Ji (ion current)>Je (electron current)), and where the potential is a maximum, the opposite is true. In the early stage of the etching process, surface currents balance the local non-uniformity in conduction currents from the plasma because the polysilicon layer 12 completely covers the wafer. Hence, no charge builds up and no damage occurs on the gate oxide 10.

Next, referring to FIG. 1B, at the stage approaching the endpoint of the etching process, the exposed polysilicon layer 12 becomes discontinuous and surface current paths are broken. Meanwhile, islands of gate electrode start to appear, and charge build-up may begin. The charging rate is determined by the net local current imbalance and the size of the exposed polysilicon layer 12. As shown in FIG. 1B, the exposed sidewall and surface of the polysilicon layer 12 can collect charges. Either a positive or a negative charge can occur with a corresponding voltage across the gate. The island voltage increases until the gate oxide 10 begins to conduct a Fowler-Nordheim tunneling current.

Referring to FIG. 1C, the exposed polysilicon and the margins of the islands of gate electrode, are continuously etched to form the gate 15 of a transistor.

Finally, referring to FIG. 1D, which is an enlarged and detailed view of the circled portion of FIG. 1C, charges that accumulate in the gate 15 result in increased tunneling current at a weak point 16 or 18 of the gate oxide 10. As the tunneling current increases, weak point 18 in the oxide is further damaged, permitting even greater current flow and forming a short area 18. This causes oxide breakdown and catastrophic device failure.

FIGS. 2A through 2E are cross-sectional views of a conventional plasma etching process used to form a gate. Firstly, referring to FIG. 2A, a silicon substrate 20 with an oxide film 22 on the top surface is provided. A polysilicon layer 24 then is formed on the oxide film 22. Next, referring to FIG. 2B, a photoresist mask 26 is formed on the polysilicon layer 24 to define a gate.

Then, referring to FIG. 2C, anisotropic plasma etching is used to remove the exposed portion of the polysilicon layer 24. As the endpoint of the etching approaches, the conductive polysilicon layer 24 becomes discontinuous and surface current paths are broken. Islands of the polysilicon layer start to appear, and charge build-up may begin. The charging rate is determined by the net local current imbalance and the amount of exposed gate area in the island. A wider polysilicon spacing can introduce a larger exposed gate area.

Referring to FIG. 2D, the exposed area of the polysilicon layer 24 decreases as etching continues. Only the sidewalls of polysilicon layer are exposed to the plasma when the endpoint is reached and the gate 28 is defined.

Finally, referring to FIG. 2E, the photoresist mask 26 is removed to complete the gate of the transistor.

Producing a polysilicon gate by the conventional method described above may easily damage the gate oxide, or more seriously may result in a failure of the transistor, which has a great impact on the yield.

SUMMARY OF THE INVENTION

It is therefore an object of the invention to provide a method for forming a gate with reduced gate oxide damage during plasma etching. According to the method, a silicon substrate is provided with a preformed film of gate oxide. A polysilicon layer is formed on the gate oxide. The polysilicon layer is patterned to form a slit in predetermined area. A masking layer is formed on the surface of the polysilicon layer surrounded by the slit. The exposed polysilicon layer is removed. The masking layer is then removed to form the gate.

BRIEF DESCRIPTION OF THE DRAWINGS

Other objects, features, and advantages of the invention will become apparent by way of the following detailed description of the preferred but non-limiting embodiment. The description is made with reference to the accompanying drawings, in which.

DESCRIPTION OF THE PREFERRED EMBODIMENT

The preferred embodiment of the invention is described below in detail with reference to FIGS. 3A–3H.

Figure 1A:
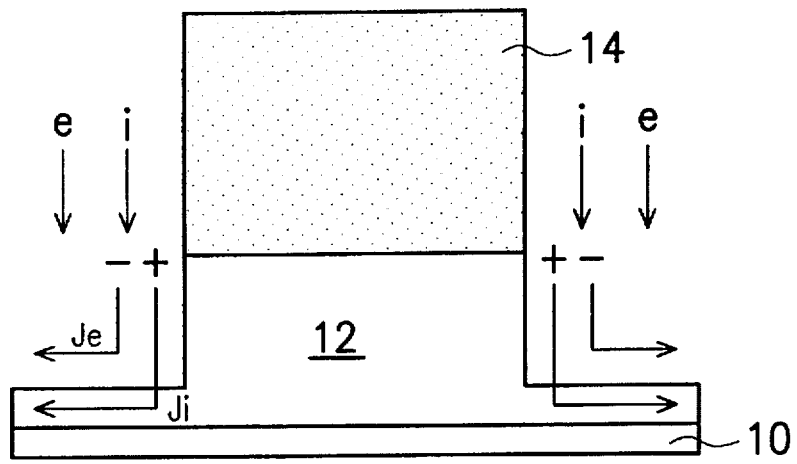
FIGS. 1A and 1D (Prior Art) are partial cross-sectional views showing the mechanism by which gate oxide damage is caused during the conventional process of plasma etching.
Figure 1B:
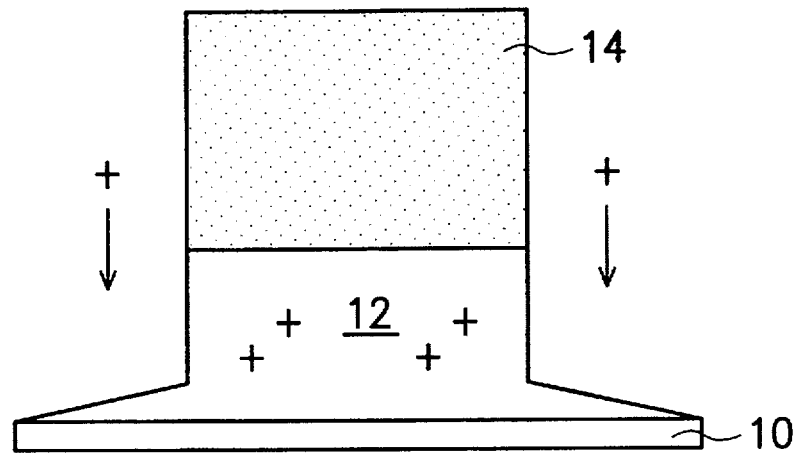
Figure 1C:
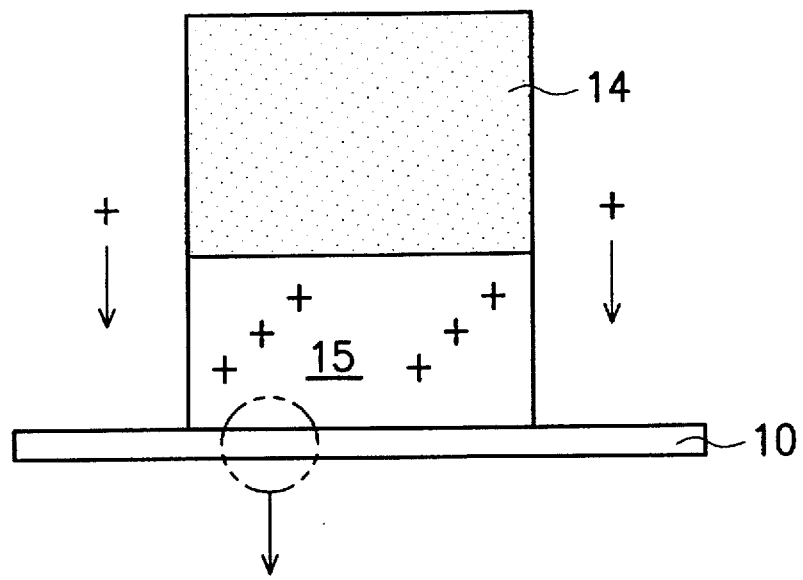
Figure 1D:
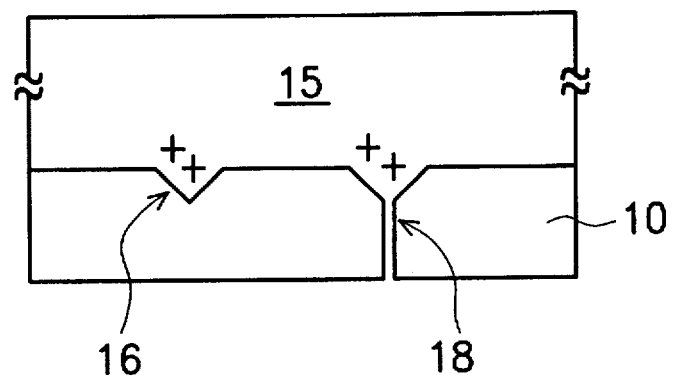
Figure 2A:
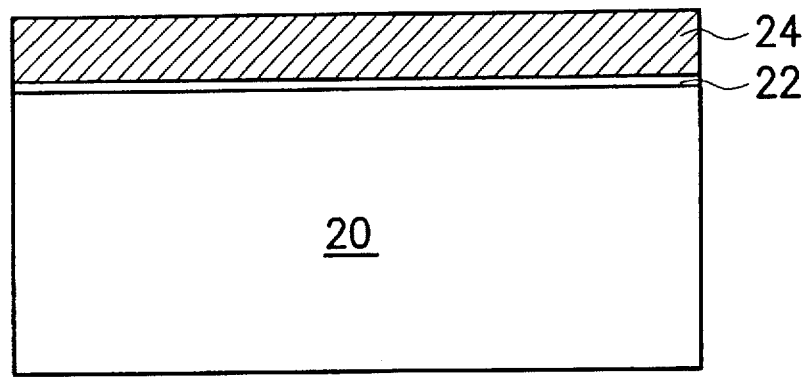
FIGS. 2A to 2E (Prior Art) are partial cross-sectional views of conventional plasma etching process steps for forming a gate.
Figure 2B:
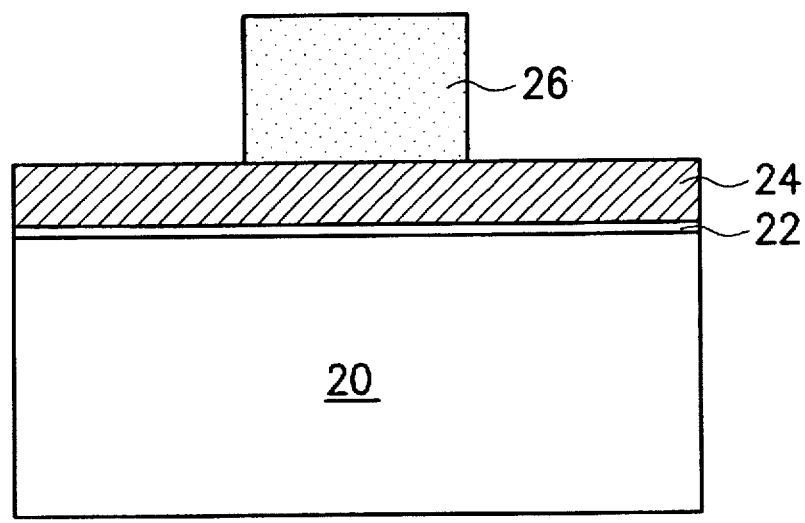
Figure 2C:
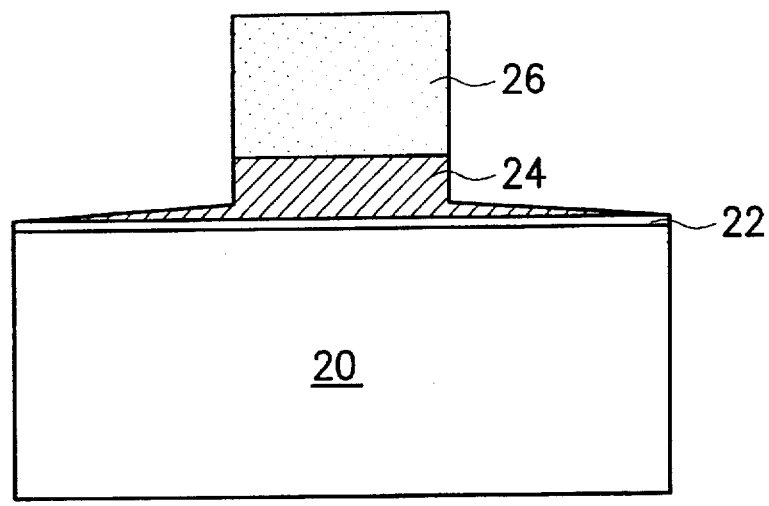
Figure 2D:
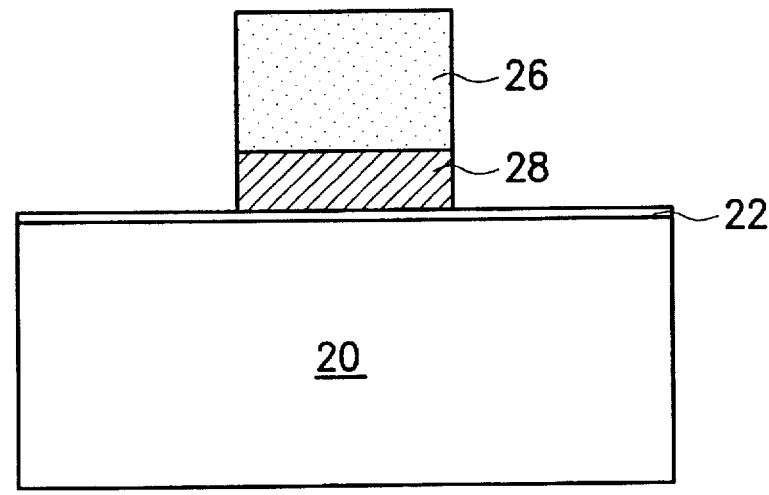
Figure 2E:
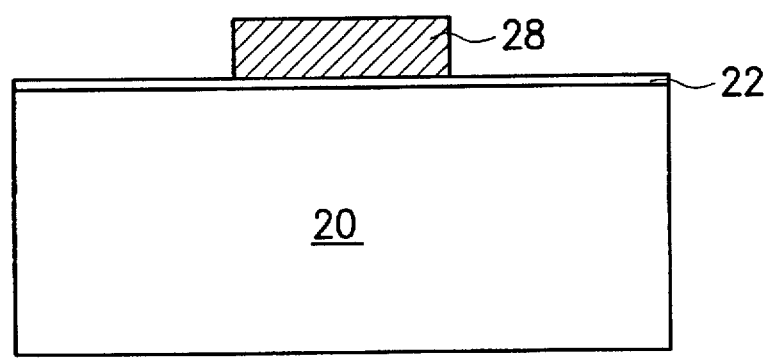
Figure 3A:
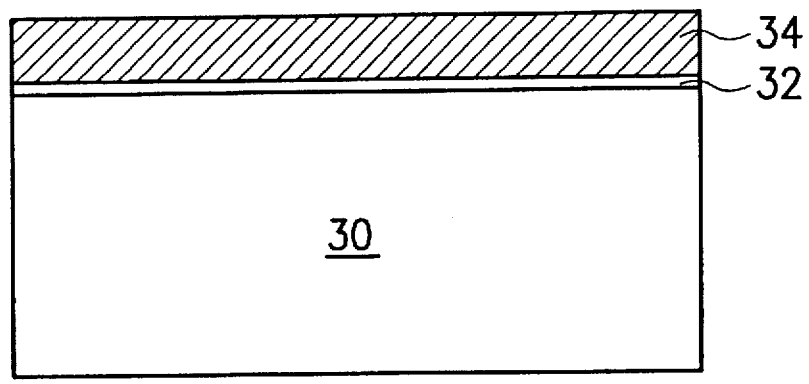
FIGS. 3A to 3H are cross-sectional views showing the flow of a process in accordance with a preferred embodiment of the invention.

Referring first to FIG. 3A, a silicon substrate 30 is covered by an oxide film 32 which functions as a gate oxide. The thickness of the oxide film 32 is preferably between about 50 Å and about 300 Å. A layer of polysilicon 34 is then deposited on the oxide film 32 by chemical vapor deposition (CVD). The preferred thickness of the polysilicon layer 34 is between about 1500 Å and about 5000 Å. The polysilicon layer 34 is then doped to an impurity concentration of about $1\times10^{19}$ to $1\times10^{21}$ atoms/cm$^3$ in order to reduce its resistance. For example, the polysilicon layer 34 is doped with phosphorus oxychloride (POCl$_3$) in an environment having a temperature in range of about 800° C. to about 1000° C.

Figure 3B:
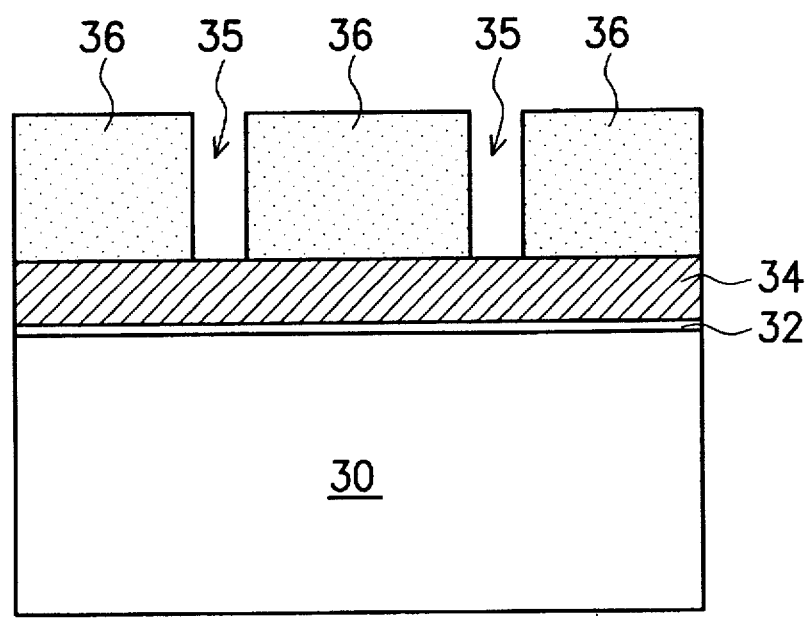

Referring now to FIG. 3B, a photoresist mask layer 36 is formed on the polysilicon layer 34. The photoresist mask layer 36 has narrow slit 35 which exposes the surface surrounding an area where a gate is predetermined to be formed on the polysilicon layer 34. The preferred width of the slit 35 is about 0.2~0.8 μm.

Figure 3C:
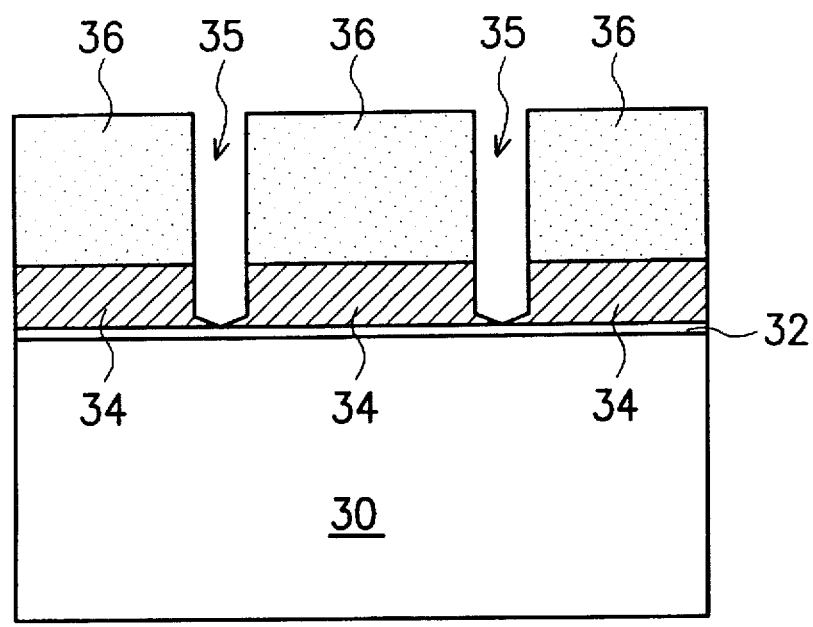

Referring to FIG. 3C, anisotropic plasma etching is performed to remove the exposed portion of the polysilicon layer, and the gas may be, for example, HBr/Cl$_2$/O$_2$. As the endpoint of the etching approaches, the polysilicon layer 34 becomes discontinuous and surface current paths are broken. Islands of polysilicon layer start to appear, and charge build-up may begin. The rate of charging is determined by the net imbalance in the local current, and the amount of exposed gate area in the island. In accordance with the invention, the exposed area of the polysilicon layer 34 is minimized to be the same size as the slit 35. Therefore, even though polysilicon layer 34 becomes discontinuous and surface current paths are broken as the endpoint approaches, the charging rate is successfully suppressed.

Figure 3D:
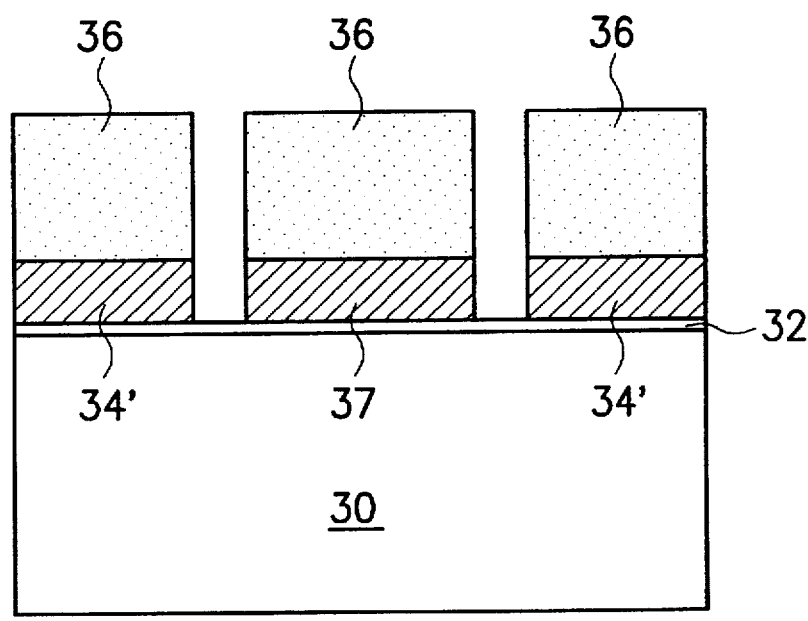

Referring to FIG. 3D, as etching continues, the exposed area of the polysilicon layer 34 decreases. Finally, when the endpoint of the etching is reached, a gate 37 and a residual polysilicon layer 34' is defined by the photoresist mask layer 36. At this point, only the sidewalls (peripheral surface) of the polysilicon are exposed to the plasma.

Figure 3E:
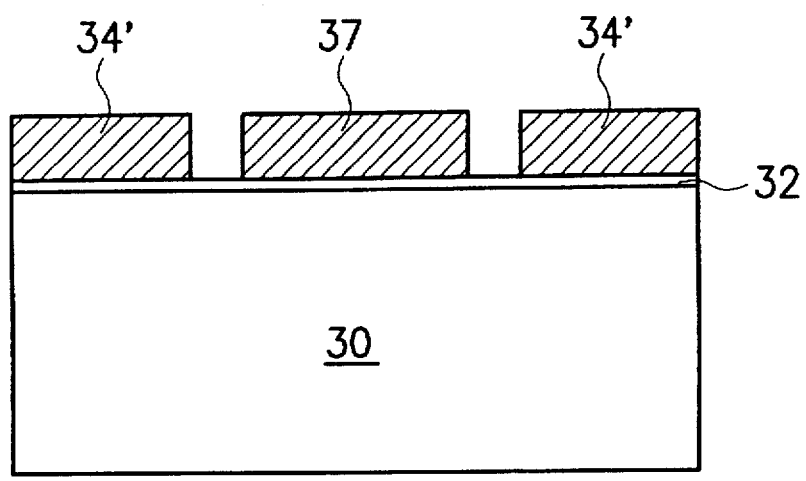
Figure 3F:
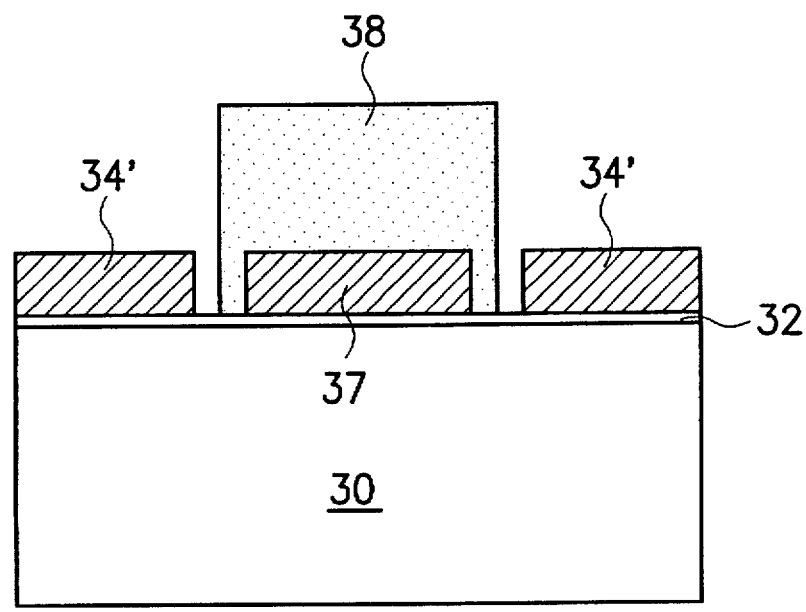

Next, as shown in FIG. 3E, the photoresist mask layer 36 is removed. Then, as shown in FIG. 3F, a masking layer 38, for example, a photoresist mask layer, is formed and patterned so that, only the gate 37 is covered by the masking layer 38 and the residual polysilicon layer 34' is exposed.

Figure 3G:
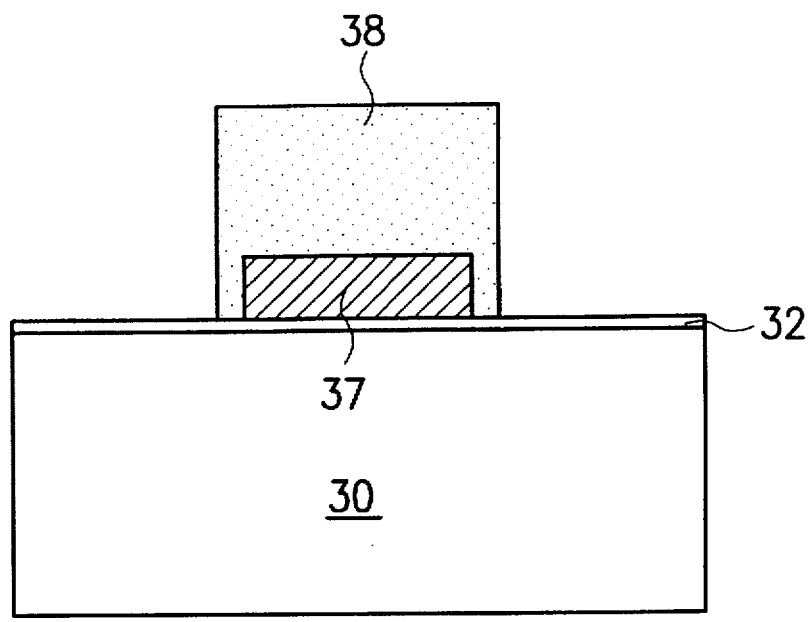
Figure 3H:
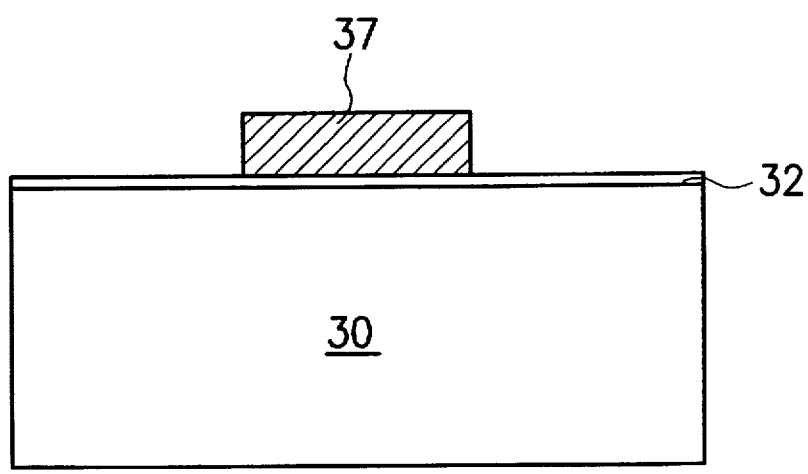

Referring to FIG. 3G, anisotropic plasma etching is performed again to remove the residual polysilicon layer 34', wherein the etching gas may be, for example, HBr/Cl$_2$/O$_2$. No charge is collected by the gate 37 since it is covered by the masking layer 38. Finally, as shown in FIG. 3H, the masking layer 38 is removed and the gate 37 is fully defined.

In accordance with the preferred embodiment of the invention, the exposed polysilicon of the gate island is reduced. Therefore, during the first anisotropic plasma etching, the rate of charging on the polysilicon is minimized, and as a result, damage to the gate oxide is diminished. Moreover, no charge collects and therefore no gate oxide damage occurs, during the second anisotropic plasma etching, since the gate is covered by, for example, a photoresist mask layer.

While the invention has been described by way of example and in terms of a preferred embodiment, it is to be understood that the invention is not limited to the disclosed embodiments. To the contrary, it is intended to cover various modifications and similar procedures, and the appended claims should be accorded the broadest interpretation so as to encompass all such modifications and similar procedures.

What is claimed is:

1. A method of forming a gate, comprising:

providing a silicon substrate covered by a film of gate oxide;

forming a polysilicon layer on the gate oxide;

patterning the polysilicon layer to form a slit surrounding a gate portion thereof, the gate portion having an upper surface and a peripheral surface, the peripheral surface being exposed to the slit;

forming a masking layer on the peripheral and upper surfaces of the gate portion of the polysilicon layer so as to cover the gate portion and leave a remaining portion of the polysilicon layer exposed;

removing the exposed portion of the polysilicon layer; and removing the masking layer to form the gate.

2. A method according to claim 1, wherein the slit has a width in a range of about 0.2μm to about 0.8 μm.

3. A method according to claim 1, wherein the patterning comprises plasma etching the polysilicon layer.

4. A method according to claim 3, wherein the etching gas is HBr/Cl$_2$/O$_2$.

5. A method according to claim 1, wherein the masking layer is a photoresist mask layer.

6. A method according to claim 1, wherein the patterning comprises anisotropic plasma etching the polysilicon layer.

7. A method according to claim 1, wherein the removing the exposed portion includes anisotropic plasma etching.

* * * * *